(12) United States Patent
Lee et al.

(10) Patent No.: US 9,872,387 B1
(45) Date of Patent: Jan. 16, 2018

(54) INPUT TERMINAL OF POWER MODULE OF DOUBLE-SIDE COOLING

(71) Applicants: Hyundai Motor Company, Seoul (KR); Kia Motors Corporation, Seoul (KR)

(72) Inventors: Hyun Koo Lee, Seoul (KR); Woo Yong Jeon, Seoul (KR); Ki Young Jang, Incheon (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 15/612,935

(22) Filed: Jun. 2, 2017

(30) Foreign Application Priority Data

Dec. 15, 2016 (KR) .......................... 10-2016-0171220

(51) Int. Cl.
*H05K 1/11* (2006.01)
*H05K 1/02* (2006.01)

(52) U.S. Cl.
CPC ............. *H05K 1/11* (2013.01); *H05K 1/0203* (2013.01)

(58) Field of Classification Search
CPC ........ H05K 1/0203; H05K 1/11; H05K 1/111; H05K 1/112; H05K 1/113; H05K 1/114; H05K 1/117
See application file for complete search history.

(56) References Cited

FOREIGN PATENT DOCUMENTS

KR    2016-0050282 A    5/2016

*Primary Examiner* — Jeremy C Norris
(74) *Attorney, Agent, or Firm* — Mintz Levin Cohn Ferris Glovsky and Popeo, P.C.; Peter F. Corless

(57) ABSTRACT

An input terminal of a power module of double-side cooling includes: a plus plate which is divided into a plurality of first terminal areas coupled with any one or more of the plurality of semiconductor chips and is connected with an anode of a battery, wherein a first bridge area connects the plurality of first terminal areas with each other; a minus plate which is divided into a plurality of second terminal areas coupled with any one or more of the plurality of semiconductor chips which are not coupled with the plus plate and is connected with a cathode of the battery, wherein a second bridge area connects the plurality of second terminal areas with each other and is disposed adjacent to the first bridge area; and a separator which is made of an insulation material and disposed between the plus plate and the minus plate.

5 Claims, 7 Drawing Sheets

[FIG.1]
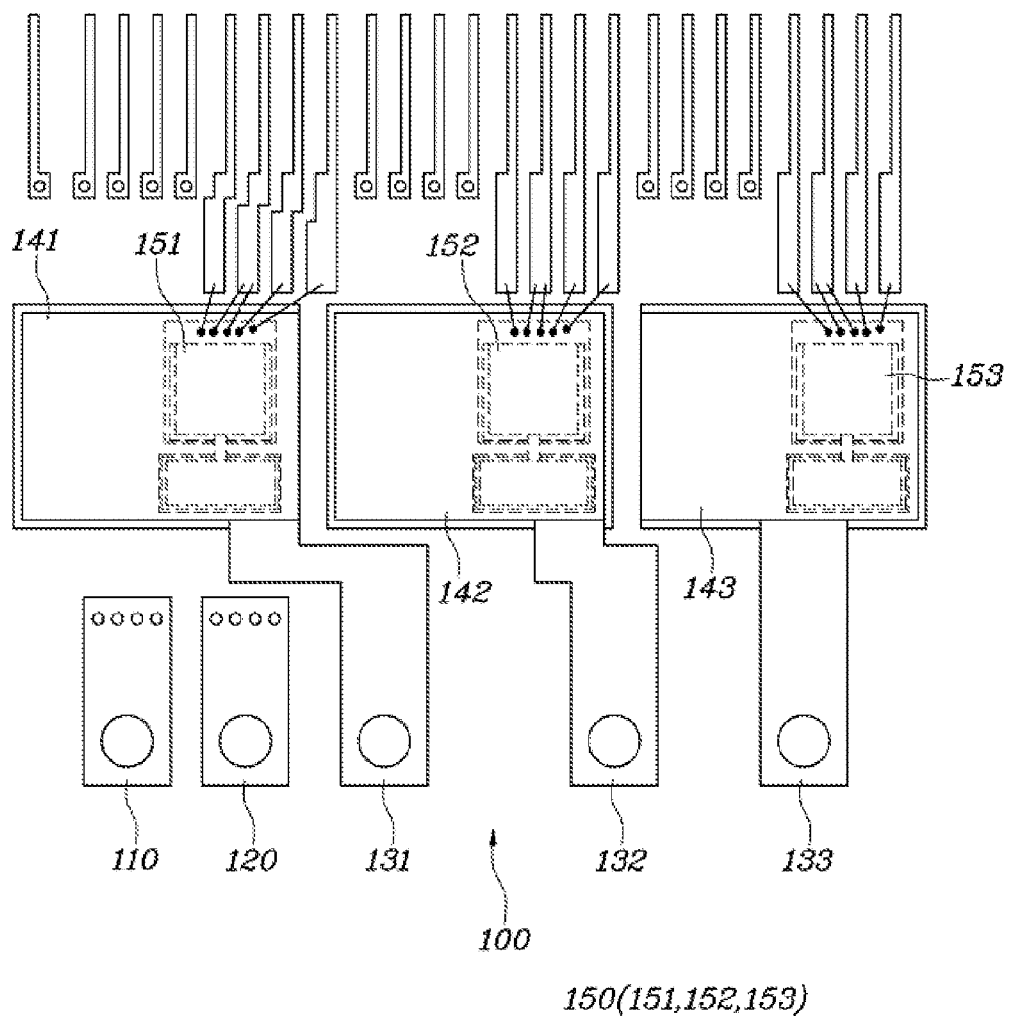
150(151,152,153)

[FIG.2]
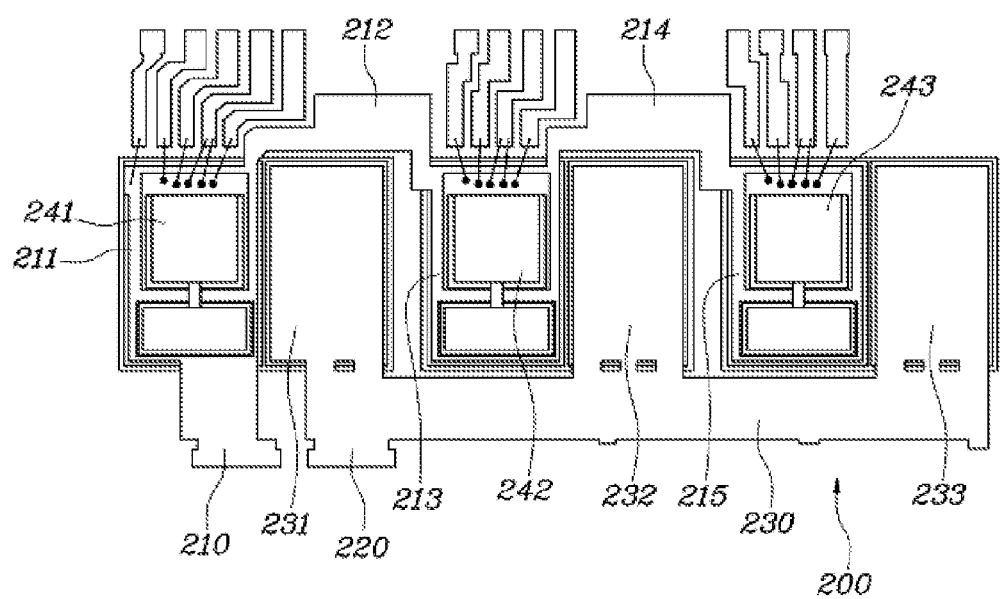

[FIG.3]
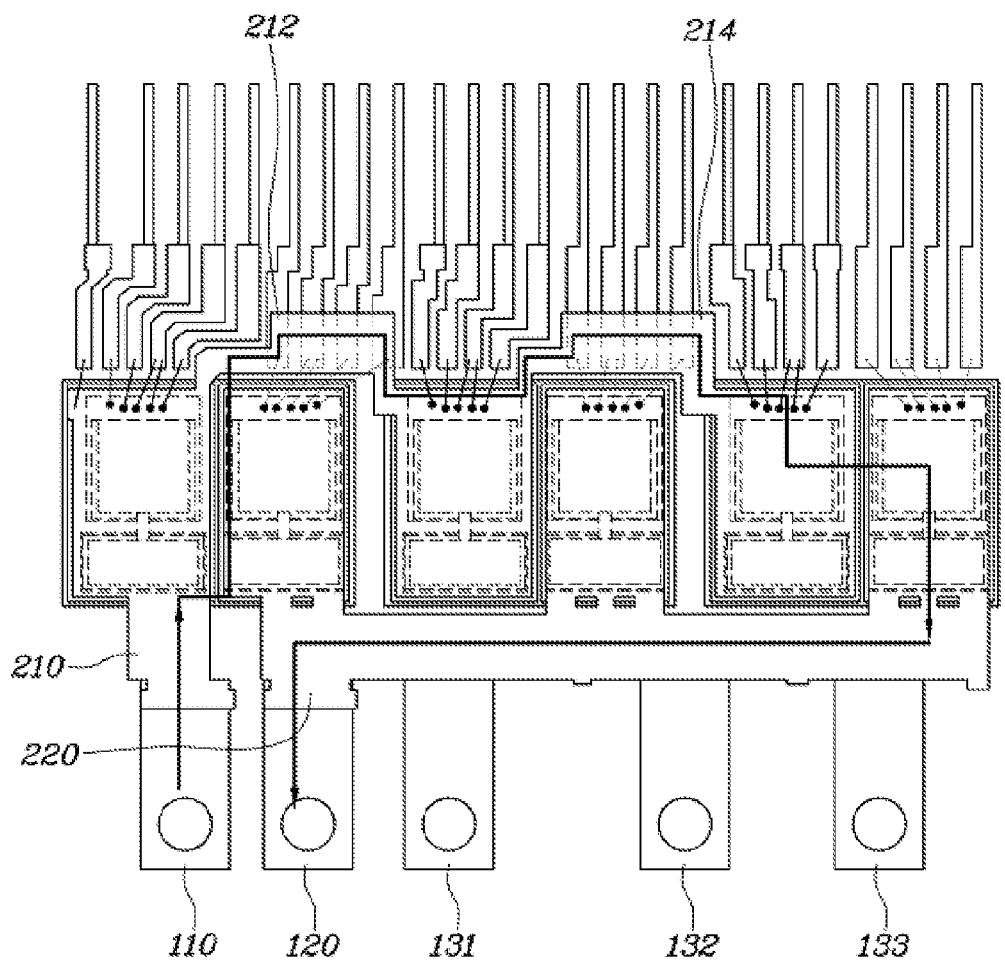

[FIG.4]
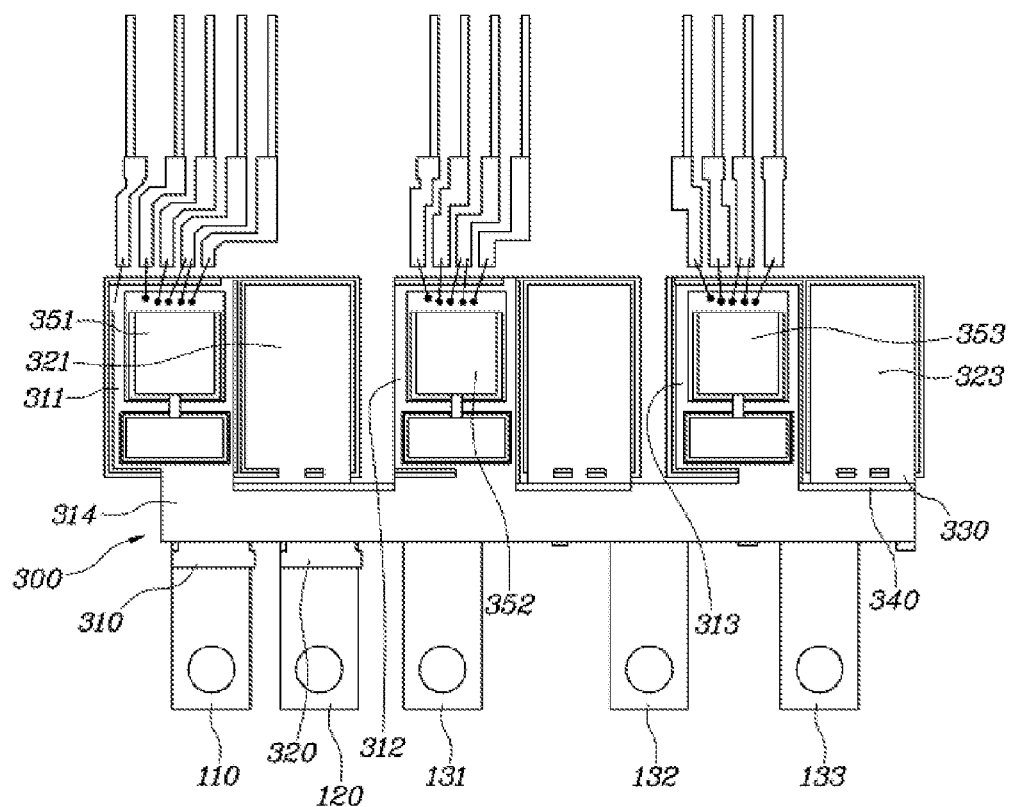
350(351,352,353)

[FIG.5]
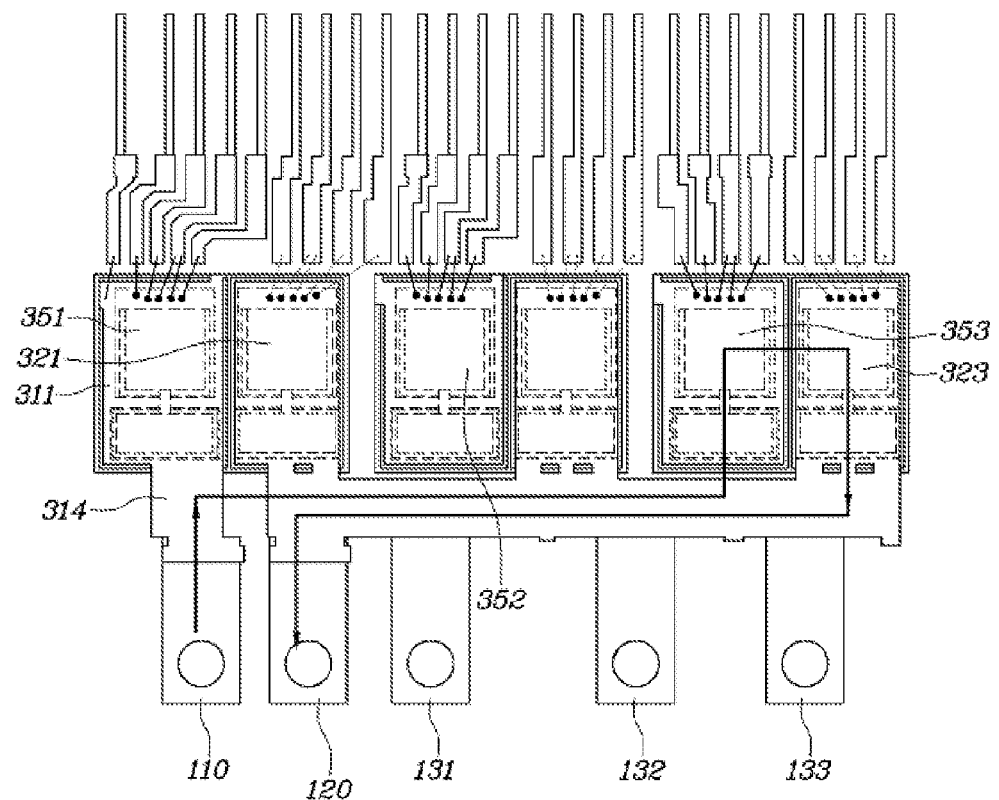

[FIG.6]
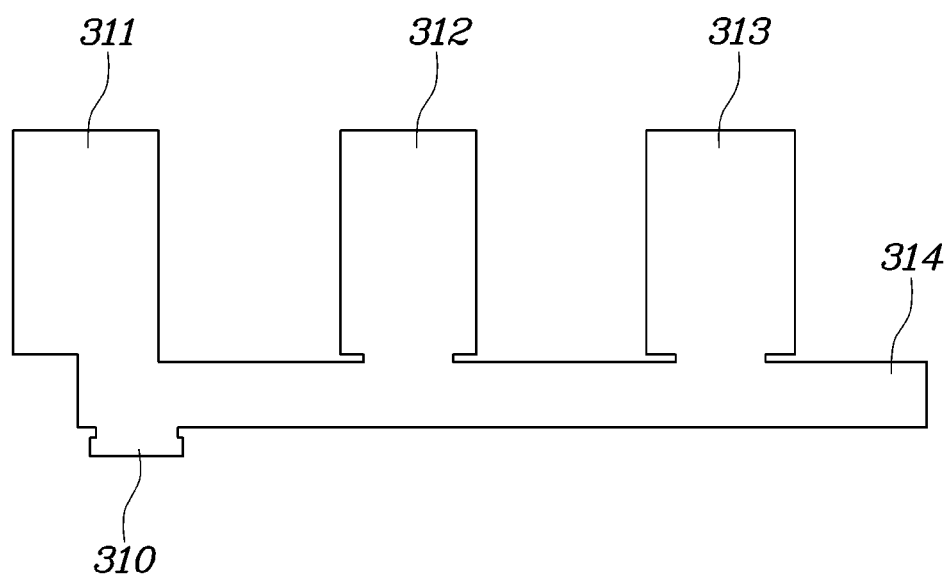
[FIG.7]
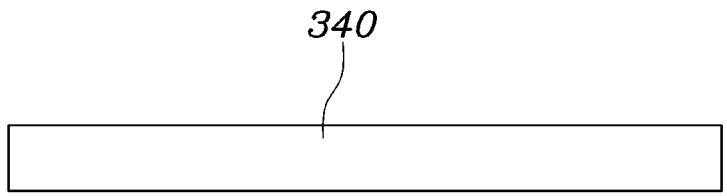

[FIG.8]
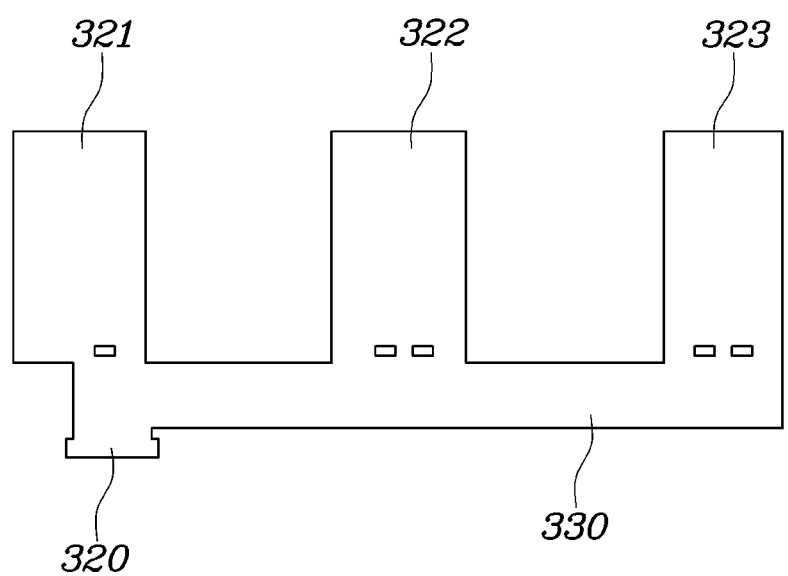

INPUT TERMINAL OF POWER MODULE OF DOUBLE-SIDE COOLING

CROSS-REFERENCE TO RELATED APPLICATION

The present application claims the benefit of priority of Korean Patent Application No. 10-2016-0171220 filed on Dec. 15, 2016, the entire contents of which are incorporated by reference as if fully set forth herein.

BACKGROUND

Technical Field

The present disclosure relates generally to an input terminal of a power module of double-side cooling, and more particularly, to an input terminal of a power module of double-side cooling for inputting power to a power module to which a cooler is mounted in a double-sided direction.

Description of the Related Art

An inverter is required to operate a drive motor equipped in a hybrid or electric vehicle. Various steps can be taken in order to improve efficiency of the drive motor, including down-sizing a power module, which is a type of switch device for composing an inverter, and improving cooling efficiency.

A power module of double-side cooling refers to a power module with coolers mounted on the outside of both circuit boards, typically by installing a semiconductor chip between the two circuit boards. With such a power module, cooling efficiency is high and circuit structure is simple in comparison with a power module of single-side cooling. Thus, the power module of double-side cooling is an important technology for down-sizing a power module.

A conventional power module of double-side cooling is illustrated in FIGS. 1 and 2. As shown in FIGS. 1 and 2, a plurality of semiconductor chips are mounted between an upper circuit board 100 and a lower circuit board 200. Coolers (not shown) provide cooling capability and are mounted on outside surfaces of the upper circuit board 100 and lower circuit board 200. Because a signal terminal and a power terminal cannot be formed in a surface direction of the power module, due to the installation of the coolers, a terminal connection portion must be formed at the side surface of the power module of double-side cooling.

In the case of a conventional "6-in-1 type" power module as shown in FIGS. 1 and 2, connection portions of a signal terminal, a power terminal, and so on are formed in an up-and down-direction in the drawings, as a plurality of devices are disposed in parallel. The signal terminal among them is an element which transmits or receives an operation signal to or from a semiconductor chip. A detailed description thereof is beyond the scope of the present disclosure and thus will be omitted.

The power terminal is composed to include a "plus" input terminal 110 connected with an anode of a battery (not shown), a "minus" input terminal 120 connected with a cathode of the battery, and a first output terminal 131, a second output terminal 132, and a third output terminal 133 respectively supplying U, V, W three phase power to a motor (not shown). On the lower circuit board 200 of the conventional power module of double-side cooling, a first plus electrode 211 is connected with an eleventh semiconductor chip 241 by being connected with the plus input terminal 110, a second plus electrode 213 is connected with a twelfth semiconductor chip 242, and a third plus electrode 215 is connected with a thirteenth semiconductor chip 243. Also on the lower circuit board 200, a first minus electrode 231 is connected with a twenty-first semiconductor chip 151 by being connected with the minus input terminal 120, a second minus electrode 232 is connected with a twenty-second semiconductor chip 152, and a third minus electrode 233 is connected with a twenty-third semiconductor chip 153. Also on the lower circuit board 200, a first connection electrode 212 connects the first plus electrode 211 with the second plus electrode 213, a second connection electrode 214 connects the second plus electrode 213 with the third plus electrode 215, and a third connection electrode 230 connects the first minus electrode 231, the second minus electrode 232, and the third minus electrode 233 with the minus input terminal 120.

For preventing a short between the plus input terminal 110 and the minus input terminal 120, because each of the plus electrodes and each of the minus electrodes must be positioned apart from each other, the first connection electrode 212 and the second connection electrode 214 are mounted in an opposite direction to the third connection electrode 230. However, as the first connection electrode 212 and the second connection electrode are mounted in the same direction with the signal terminal, the circuit structure can become overly complex for preventing interference between the signal terminal and the power terminal. Particularly, as shown in FIG. 3, a current moving distance of current passing through the thirteenth semiconductor chip 243 is excessively long.

Therefore, a new input terminal structure of a power module of double-side cooling is needed to minimize stray/leak inductance, while simplifying circuit structure by decreasing the moving distance of current.

The foregoing is intended merely to aid in the understanding of the background of the present disclosure, and is not intended to mean that the present disclosure falls within the purview of the related art that is already known to those skilled in the art.

SUMMARY

The present disclosure has been made in an effort to provide an input terminal of a power module of double-side cooling having advantages of improving efficiency of the power module by minimizing stray inductance.

According to embodiments of the present disclosure, an input terminal of a power module of double-side cooling includes: a plus plate which is divided into a plurality of first terminal areas coupled with any one or more of the plurality of semiconductor chips and is connected with an anode of a battery, wherein a first bridge area connects the plurality of first terminal areas with each other; a minus plate which is divided into a plurality of second terminal areas coupled with any one or more of the plurality of semiconductor chips which are not coupled with the plus plate and is connected with a cathode of the battery, wherein a second bridge area connects the plurality of second terminal areas with each other and is disposed adjacent to the first bridge area; and a separator which is made of an insulation material and disposed between the plus plate and the minus plate.

The first bridge area may be longitudinally formed along sides of the plurality of first terminal areas which extend from one side surface of each of the plurality of first terminal areas so as to be disposed in parallel, the second bridge area may be longitudinally formed along sides of the plurality of second terminal areas which extend from one side surface of each of the plurality of second terminal areas so as to be disposed in parallel, and the plurality of first terminal areas and the plurality of second terminal areas may be alternately disposed in parallel.

The plurality of first terminal areas and the plurality of second terminal areas may be respectively formed in groups of three, a first semiconductor chip may be mounted on each of the plurality of first terminal areas, and a second semiconductor chip may be mounted on each of the plurality of second terminal areas.

The plurality of first terminal areas may include: an eleventh terminal area to which an eleventh semiconductor chip outputting U-phase power is mounted, a twelfth terminal area to which a twelfth semiconductor chip outputting V-phase power is mounted, and a thirteenth terminal area to which a thirteenth semiconductor chip outputting W-phase power is mounted. The plurality of second terminal areas may include: a twenty-first terminal area to which a twenty-first semiconductor chip outputting U-phase power is mounted, a twenty-second terminal area to which a twenty-second semiconductor chip outputting V-phase power is mounted, and a twenty-third terminal area to which a twenty-third semiconductor chip outputting W-phase power is mounted.

The first bridge area may be formed to be bent in a height direction so as to be not connected with the second bridge area or the plurality of second terminal areas.

Accordingly, the input terminal of a power module of double-side cooling according to the present disclosure exhibits at least the following advantageous effects.

Firstly, efficiency of the power module can be improved by minimizing stray inductance generated depending on position of a power module input terminal which is unsymmetrically composed.

Secondly, a circuit structure can be simplified as a plus terminal and a minus terminal of a power module are closely disposed to one another.

BRIEF DESCRIPTION OF THE DRAWINGS

The above and other objects, features and advantages of the present disclosure will be more clearly understood from the following detailed description taken in conjunction with the accompanying drawings, in which:

FIG. 1 is a drawing illustrating an upper circuit board of a conventional power module of double-side cooling.

FIG. 2 is a drawing illustrating a lower circuit board of a conventional power module of double-side cooling.

FIG. 3 is a drawing illustrating moving route of current of W-phase power in a conventional power module of double-side cooling.

FIG. 4 is a drawing illustrating a lower circuit board of a power module of double-side cooling according to embodiments of the present disclosure.

FIG. 5 is a drawing illustrating moving route of current of W-phase power in a power module of double-side cooling according to embodiments of the present disclosure.

FIG. 6 is a exploded view of a input terminal part in a lower circuit board of a power module of double-side cooling according to embodiments of the present disclosure.

FIG. 7 is a minus plate connecting a cathode of a battery with a semiconductor chip of a power module according to embodiments of the present disclosure.

FIG. 8 is a drawing illustrating a separator made of an insulation material according to embodiments of the present disclosure.

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment.

DETAILED DESCRIPTION OF THE EMBODIMENTS

The terminologies used hereafter are only for describing embodiments of the present disclosure and not intended to limit the present disclosure. The singular terms used herein include plural terms unless phrases clearly express opposite meanings. The term "including" used herein refers to concrete specific characteristics, regions, positive numbers, steps, operations, elements, and/or components, not limiting the existence or addition of other specific characteristics, regions, positive numbers, steps, operations, elements, and/or components.

As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

All the terms, including technical terms and scientific terms used hereafter, have the same meanings as those that those skilled in the art generally understand. The terms defined in dictionaries should be construed as having meanings corresponding to the related prior art documents and those stated herein, and not be construed as being ideal or official, if not otherwise defined.

Hereinafter, an input terminal of a power module of double-side cooling according to embodiments of the present disclosure will be described with reference to the accompanying drawings.

As shown in FIGS. 4-6, an input terminal according to embodiments of the present disclosure has a structure in which three compositions are stacked, that is, disposed adjacent to one another. In this regard, a plus plate 310 connecting an anode of a battery (not shown) with a semiconductor chip of an interior of a power module, a minus plate 320 connecting a cathode of the battery with a semiconductor chip of the interior of the power module, and a separator 340 disposed between the plus plate 310 and the minus plate 320 so as to insulate the two compositions are included. The plus plate 310, the minus plate 320, and the separator 340 compose a lower circuit board 300.

The plus plate 310 is divided into a plurality of first terminal areas 311, 312, and 313 respectively connected with a plurality of first semiconductor chips 350 mounted on the lower circuit board 300 among semiconductor chips 150 and 350 and first bridge areas 314 connecting the plurality of first terminal area 311, 312, and 313 with each other. In this regard, the first bridge area 314 is installed to be protruded from a area of mounting the first semiconductor chip 350 to a side surface.

As shown in FIG. 8, the minus plate 320 is divided into a plurality of second terminal areas 321, 322, and 323 respectively connected with a plurality of second semiconductor chips 150 mounted on an upper circuit board 100 among semiconductor chips 150 and 350 and second bridge areas 330 connecting the plurality of second terminal area 321, 322, and 323 with each other and being stacked with, or disposed adjacent to, the first bridge areas 314. Though the second bridge area 330 is formed to protrude in the same direction with the first bridge area 314, the second bridge area 330 is installed to maintain insulation condition with the first bridge area 314.

The separator 340, as shown in FIG. 7, which is made of an insulation material, is mounted between the first bridge area 314 and the second bridge area 330, thereby preventing the flow of current between the first bridge area 314 and the second bridge area 330.

The plus plate 310 and the minus plate 320 are stacked with, or disposed adjacent to, each other so as to form a kind of laminate bus bars. These have a wide width in comparison with thickness and are disposed to face with each other so as to minimize generation of stray inductance and leak inductance.

The input terminal according to embodiments of the present disclosure may be applied to a 4-in-1 or 6-in-1 type power module of double-side cooling in which two semiconductor chips are respectively mounted and coupled in groups of two or three. Hereinafter, embodiments according to a 6-in-1 type power module of double-side cooling coupled in groups of three will be described.

One first semiconductor chip 350 is mounted to the first terminal area 311, 312, and 313, and one second semiconductor chip 150 is mounted to the second terminal area 321, 322, and 323. For realizing a power module of double-side cooling of 6in1 type, the first terminal areas 311, 312, and 313 and the second terminal areas 321, 322, and 323 are respectively installed in groups of three.

The first terminal area 311, 312, and 313 is composed to include an eleventh terminal area 311 making a connection between the anode of the battery and an eleventh semiconductor chip 351, a twelfth terminal area 312 making a connection between the anode of the battery and a twelfth semiconductor chip 352, and a thirteenth terminal area 313 making a connection between the anode of the battery and a thirteenth semiconductor chip 353.

Similarly, the second terminal area 321, 322, and 323 is composed to include a twenty-first terminal area 321 making a connection between the cathode of the battery and a twenty-first semiconductor chip 151, a twenty-second terminal area 322 making a connection between the cathode of the battery and a twenty-second semiconductor chip 152, and a twenty-third terminal area 323 making a connection between the cathode of the battery and a twenty-third semiconductor chip 153.

The eleventh semiconductor chip 351 and the twenty-first semiconductor chip 151 generate U-phase power and output to a motor (not shown) through the first output terminal 131, and the twelfth semiconductor chip 352 and the twenty-second semiconductor chip 152 generate V-phase power and output to the motor through the second output terminal 132, and the thirteenth semiconductor chip 353 and the twenty-third semiconductor chip 153 generate W-phase power and output to the motor through the third output terminal 133.

A part of the first bridge area 314 may be formed to be bent in a height direction and may be disposed at a direction of an upper side surface of the second bridge area 330 such that the first bridge area 314 and the second bridge area 330 are not connected with each other. In this regard, stray inductance and leak inductance can be minimized because the current flow distance between compositions is formed to be short, such as between the eleventh terminal area 311 and the twenty first terminal area 321, the twelfth terminal area 312 and the twenty second terminal area 322, the thirteenth terminal area 313 and the twenty third terminal area 323, the first bridge area 314 and the second bridge area 330, and so on.

Although embodiments of the present disclosure have been disclosed above for illustrative purposes, those skilled in the art will appreciate that various modifications, additions and substitutions are possible, without departing from the scope and spirit of the disclosure as disclosed in the accompanying claims.

What is claimed is:

1. An input terminal for transmitting power to a power module of double-side cooling, wherein a plurality of semiconductor chips are mounted between an upper circuit board and a lower circuit board of the power module, the input terminal comprising:
   a plus plate which is divided into a plurality of first terminal areas coupled with any one or more of the plurality of semiconductor chips and is connected with an anode of a battery, wherein a first bridge area connects the plurality of first terminal areas with each other;
   a minus plate which is divided into a plurality of second terminal areas coupled with any one or more of the plurality of semiconductor chips which are not coupled with the plus plate and is connected with a cathode of the battery, wherein a second bridge area connects the plurality of second terminal areas with each other and is disposed adjacent to the first bridge area; and
   a separator which is made of an insulation material and disposed between the plus plate and the minus plate.

2. The input terminal of claim 1, wherein:
   the first bridge area is longitudinally formed along sides of the plurality of first terminal areas which extend from one side surface of each of the plurality of first terminal areas so as to be disposed in parallel,
   the second bridge area is longitudinally formed along sides of the plurality of second terminal areas which extend from one side surface of each of the plurality of second terminal areas so as to be disposed in parallel, and
   the plurality of first terminal areas and the plurality of second terminal areas are alternately disposed in parallel.

3. The input terminal of claim 1, wherein:
   the plurality of first terminal areas and the plurality of second terminal areas are respectively formed in groups of three,
   a first semiconductor chip is mounted on each of the plurality of first terminal areas, and
   a second semiconductor chip is mounted on each of the plurality of second terminal areas.

4. The input terminal of claim 3, wherein:
   the plurality of first terminal areas includes: an eleventh terminal area to which an eleventh semiconductor chip outputting U-phase power is mounted, a twelfth terminal area to which a twelfth semiconductor chip outputting V-phase power is mounted, and a thirteenth terminal area to which a thirteenth semiconductor chip outputting W-phase power is mounted, and
   the plurality of second terminal areas includes: a twenty-first terminal area to which a twenty-first semiconductor chip outputting U-phase power is mounted, a twenty-second terminal area to which a twenty-second semiconductor chip outputting V-phase power is mounted, and a twenty-third terminal area to which a twenty-third semiconductor chip outputting W-phase power is mounted.

5. The input terminal of claim 4, wherein the first bridge area is formed to be bent in a height direction so as to be not connected with the second bridge area or the plurality of second terminal areas.

* * * * *